United States Patent
Suda et al.

(10) Patent No.: US 7,622,763 B2
(45) Date of Patent: Nov. 24, 2009

(54) FIELD EFFECT TRANSISTOR AND METHOD FOR MANUFACTURING SAME

(75) Inventors: Jun Suda, Shiga (JP); Hiroyuki Matsunami, Kyoto (JP)

(73) Assignee: Japan Science and Technology Agency, Saitama (JP)

( * ) Notice: Subject to any disclaimer, the term of this patent is extended or adjusted under 35 U.S.C. 154(b) by 535 days.

(21) Appl. No.: 10/565,624

(22) PCT Filed: Jul. 28, 2004

(86) PCT No.: PCT/JP2004/010696

§ 371 (c)(1),
(2), (4) Date: Jan. 24, 2006

(87) PCT Pub. No.: WO2005/010974

PCT Pub. Date: Feb. 3, 2005

(65) Prior Publication Data
US 2006/0194379 A1   Aug. 31, 2006

(30) Foreign Application Priority Data
Jul. 28, 2003   (JP)  .............................. 2003-281104

(51) Int. Cl.
*H01L 29/792*   (2006.01)
(52) U.S. Cl. .................. 257/315; 257/E29.129
(58) Field of Classification Search .................. 257/314, 257/76, 77, 410, 613, 629
See application file for complete search history.

(56) References Cited

U.S. PATENT DOCUMENTS 5,900,648 A * 5/1999 Harris et al. ................... 257/77
7,005,344 B2 * 2/2006 Forbes et al. ................. 438/257

FOREIGN PATENT DOCUMENTS

| FR | 2 707 425 | 7/1993 |
| JP | 2000-150792 | 11/1998 |
| JP | 2000-150875 | 11/1998 |
| JP | 2001-094099 | 9/1999 |
| JP | 2002-246594 | 12/2001 |

OTHER PUBLICATIONS

International Search Report of PCT/JP2004/010696 mailed Nov. 9, 2004.
James Kolodzey et al., "Electrical Conduction and Dielectric Breakdown in Aluminum Oxide Insulators on Silicon", IEEE Transactions on Electron Devices., vol. 47, No. 1, Jan. 2000, pp. 121-128.

(Continued)

*Primary Examiner*—Sue Purvis
*Assistant Examiner*—Selim Ahmed
(74) *Attorney, Agent, or Firm*—Stites & Harbison PLLC; Juan Carlos A. Marquez, Esq.

(57) ABSTRACT

A field effect transistor comprises a SiC substrate 1, a source 3a and a drain 3b formed on the surface of the SiC substrate 1, an insulating structure comprising an AlN layer 5 formed in contact with the SiC surface and having a thickness of one molecule-layer or greater, and a $SiO_2$ layer formed thereon, and a gate electrode 15 formed on the insulation structure. Leakage current can be controlled while the state of interface with SiC is maintained in a good condition.

10 Claims, 10 Drawing Sheets

OTHER PUBLICATIONS

N. Onojima et al., "Heteroepitaxial Growth of Insulating AlN on 6H-SiC by MBE", Materials Science Forum vols. 389-393, (2002), pp. 1457-1460.

N. Onojima et al., "Impact of SiC Surface Control on Initial Growth Mode and Crystalline Quality of AlN Grown by Molecular-Beam Epitaxy", 5th International Conference on Nitride Semiconductors, May 25-30, 2003, Technical Digest, pp. 28 and 228.

N. Onojima et al., "Lattice Relaxation Process of AlN Growth on Atomically Flat 6H-SiC Substrate in Molecular Beam Epitaxy", Journal of Crystal Growth (2002), pp. 1012-1016.

N. Onojima et al., "Molecular-Beam Epitaxial Growth of Insulating AlN on Surface-Controlled 6H-SiC Substrate by HCl Gas Etching", Applied Physics Letters, vol. 80, No. 1, Jan. 7, 2002, pp. 76-78.

Jun Suda et al., "Effects of 6H-SiC Surface Reconstruction on Lattice Relaxation of AlN Buffer Layers in Molecular-Beam Epitaxial Grown of GaN", Applied Physics Letters, vol. 81, No. 27, Dec. 30, 2002, pp. 5141-5143.

N. Onojima et al., "Impact of SiC Surface control on Initial Growth Mode and Crystalline Quality of AlN Grown by Molecular-Beam Epitaxy", Phys. Stat. Sol. No. 7 (2003), pp. 2529-2532.

N. Onojima et al., "High-Quality AlN by Initial Layer-by-Layer Growth on Surface-Controlled 4H-SiC(0001) Substrate", Jpn. J. Appl. Phys., vol. 42 (May 1, 2003), pp. L445-L447.

Supplementary European Search Report dated Nov. 28, 2008 regarding European Patent Application No. 04748008.2—1235/ 1662558 PCT/JP2004010696.

Zetterling, C.-M., et al., "SiC MISFETs with MBE-grown AlN Gate Dielectric", Materials Science Forum vols. 338-342 (2000) pp. 1315-1318.

\* cited by examiner

ION IMPLANTATION

FORMATION OF SOURCE/DRAIN REGIONS (ANNEALING)

FORMATION OF GATE,
SOURCE/DRAIN ELECTRODES

FIELD EFFECT TRANSISTOR AND METHOD FOR MANUFACTURING SAME

TECHNICAL FIELD

The present invention relates to a SiC-based MISFET and particularly to a MISFET having an AlN-based insulating film.

BACKGROUND ART

SiC has excellent physical property values including the forbidden-band width of 3 eV or greater and the extremely high breakdown field intensity of 2.5 MV/cm or greater. Thus, it is gaining attention as a semiconductor material that can be used for realizing an ultralow-loss power transistor, a high-output, high-frequency transistor, or a field effect transistor having an extremely small gate length, all of which cannot be realized theoretically with the existing semiconductors, such as Si and GaAs.

However, when a metal-silicon oxide film-semiconductor field effect transistor (MOSFET), which is the basic structure of field effect transistor devices having an insulated gate, is prepared using SiC, the effective channel electron mobility at the $SiO_2$/SiC interface becomes much smaller than the electron mobility of bulk SiC, resulting in an increase in channel resistance. As a result, the on-characteristics of the transistor deteriorate, making the realization of high-performance devices difficult.

The cause for the extremely small effective channel electron mobility is believed to exist in the $SiO_2$/SiC interface. Various measures have so far been taken with regard to the $SiO_2$/SiC formation processes and the like, such as analysis of oxidation temperature and oxidative atmosphere of SiC, addition of nitrogen to a silicon oxide film, and changes in the orientation of SiC crystal that is oxidized.

Meanwhile, there is another attempt to use an insulating film other than $SiO_2$ as the gate insulating film. Contemplated substances include amorphous substances similar to the oxide film and single-crystal substances similar to SiC. Of such substances, attention is being focused on AlN because it has a hexagonal crystal structure without inversion symmetry, as in SiC, and because the lattice constants of AlN and SiC are relatively close. A report has already been made regarding a prototype of a metal/AlN/SiC-based metal-insulator-semiconductor field effect transistor (MISFET) (see Non-Patent Document 1, for example).

However, it has been very difficult to grow a high-quality AlN crystal on the surface of SiC. Because the only AlN layer that has been available was of low quality, a large leakage current flows in the AlN layer. As a result, the AlN/SiC-based MISFETs that have been made have very poor gate insulating property in particular, and no devices have been realized that are suitable for practical application.

Lately, the present inventors have found a method for growing a high-quality AlN crystal on the SiC surface and succeeded in the growth of an AlN layer crystal that has a very good insulting property. Nevertheless, even if the AlN is of high quality, it has been theoretically and experimentally verified that, because the conduction-band discontinuous quantity between AlN and SiC is approximately 2.0 eV, which is not much larger than the discontinuous quantity of 2.74 eV between $SiO_2$ and SiC, if an electric field of close to 3 MV/cm is applied to the AlN layer, electrons tunnel through the AlN layer due to quantum-mechanical tunneling effect, whereby gate insulating property is lost (see Non-patent Document 2, for example).

Non-patent Document 1: C.-M. Zetterling, M. Ostling, H. Yano, T. Kimoto, H. Matsunami, K. Linticum and R. F. Davis, "SiC MISFETs with MBE-grown AlN Gate Dielectric", Material Science Forum Vols. 338-342(2000) pp. 1315-1318.

Non-patent Document 2: Norio Onojima, Jun Suda, and Hiroyuki Matsunami, "Molecular-beam epitaxial growth of insulating AlN on surface-controlled 6H—SiC substrate by HCl gas etching", Applied Physics Letters, Vol. 80, No. 1, (2002) p. 76-78.

DISCLOSURE OF THE INVENTION

Problem to be Solved by the Invention

It is conceivable to reduce the electric field to 3 MV/cm or lower by increasing the thickness of the AlN layer. However, given the fact that the lattice mismatch between AlN and SiC is approximately 0.9%, the maximum thickness of the AlN layer is 30 nm. Namely, if the thickness is more than 30 nm, a number of misfit dislocations would be introduced into the AlN layer, which would result in an increase in the leakage current due to the lowering of the crystallinity of the AlN layer.

The conduction band offset of AlN/SiC is reported to be approximately 2.0 eV. The electrical insulating property in this structure is defined by tunneling current. According to a rough calculation based on the physical property values of AlN, tunneling current would increase upon application of an electric field of approximately 3 MV/cm or more to the AlN layer side of the AlN/SiC interface, resulting in a loss of insulation. When a test device was actually prepared and tested, the result shown in FIG. 10 was obtained. FIG. 10 shows the relationship between field intensity and current density for an AlN/SiC MIS diode. As shown in FIG. 10, in the aforementioned structure, the current that flows through the insulating film exceeds $10^{-6}$ A/cm$^2$ when the field applied to AlN is on the order of 3 MV/cm. It is theoretically impossible to make a significant increase in this dielectric voltage of 3 MV/cm as long as the AlN/SiC structure is employed.

When $SiO_2$ is used, which has a greater bandgap than AlN, the upper limit would be improved to nearly 7 MV/cm and the aforementioned problem could be avoided. However, it is difficult to form a good interface between $SiO_2$ and SiC, and the effective channel electron mobility would decrease.

It is an object of the invention to provide a high-performance, insulated-gate SiC-based MISFET.

Means for Solving the Problem

In one aspect, the invention provides a field effect transistor comprising: a SiC surface structure; a source and a drain formed on said SiC surface structure; an insulating structure comprising an interface control layer formed in contact with said SiC surface structure and including a Group-III nitride layer having a thickness of one molecule-layer or greater, and an insulating layer formed on said interface control layer from a material that is different from said interface control layer and that has a larger band offset with respect to a conduction layer than said interface control layer; and a gate electrode formed on said insulating structure.

In accordance with this field effect transistor that has a multilayer-structure insulator including an interface control layer for forming a good interface with SiC, and an insulating layer that has a larger band offset with respect to a conduction carrier than the interface control layer, reduction in conduction carrier transfer rate can be suppressed, and gate leakage via the insulating structure of the field effect transistor can be reduced. The Group-III nitride preferably contains Al and N, in which case the influence of lattice mismatch can be reduced when the thickness is 6 nm or smaller.

Alternatively, the interface control layer preferably includes a $B_xAl_{1-x-y}Ga_yN$ layer (x<0.4, y<0.4), which is capable of achieving lattice matching with the SiC layer, allowing the formation of a good interface between the Group-III nitride and SiC.

The insulating layer may comprise either: an $Al_2O_3$ layer that is formed by oxidizing a deposition layer of at least one material selected from the group consisting of AlN, Al, $Al_xN_y$, AlAs, and $AlN_xAs_{1-x}$, or an $Al_2O_3$ layer containing small amounts of at least one of N or As. In this way, the manufacturing process can be simplified.

In yet another aspect, the invention provides a method for manufacturing a field effect transistor comprising the steps of:

preparing a substrate having a SiC surface structure; forming a source and a drain on said SiC surface structure; cleaning the surface of said SiC surface structure; forming an insulating structure comprising an interface control layer and an insulating layer, wherein said interface control layer is formed in contact with said SiC surface structure, contains Al and N, and has a thickness of one molecule-layer or greater, and wherein said insulating layer is formed on said interface control layer from a material different from said interface control layer and that has a greater band offset with respect to a conduction carrier than said interface control layer; and forming a gate electrode on said insulating structure.

In accordance with this method, whereby an interface control layer is formed in contact with the SiC surface structure whose surface has been step-structure-controlled and washed, a good state of interface with SiC can be achieved. Furthermore, by forming an insulating layer on the interface control layer having a high current-suppressing effect, leakage current can be suppressed while a good interface condition is maintained.

EFFECT OF THE INVENTION

Thus, in accordance with the invention, leakage current can be suppressed while a good interface condition with SiC is maintained, whereby a high-performance insulated-gate SiC-based MISFET can be realized.

BEST MODES FOR CARRYING OUT THE INVENTION

In a MISFET according to the invention, a Group III nitride having a crystal structure similar to that of SiC, such as AlN single crystal, is used in an insulator/SiC interface, through which electrons travel, in contact with the SiC surface. In addition, another insulating film is used for ensuring gate insulation.

In the following, embodiments of the invention are described with reference to the drawings. First, a MISFET according to a first embodiment of the invention is described with reference to the drawings. With reference to FIG. 1(A) to FIG. 4(J), a method for manufacturing the MISFET of the first embodiment is described. As shown in FIG. 1(A), on a 4H—SiC(0001)$_{Si}$ substrate 1 (a just substrate or a substrate having an offset angle of 15° or less in an arbitrary crystal direction; if the offset angle is greater, problems regarding the proximity of steps or the formation of facets would arise, which would require consideration of other crystal growth mechanisms. The SiC crystal structure may be 6H instead of 4H.), there is formed a SiC layer 1a by homoepitaxial growth, for example. The epitaxial layer is a high-quality single-crystal layer. As shown in FIG. 1(B), on the SiC layer 1a, there is formed a mask R having openings in at least those regions where source/drain are to be later formed. Then, N and P, for example, which are Group V elements, are ion-implanted as impurities for forming an n-type conduction band in SiC. Thereafter, a high-temperature annealing process is performed so as to electrically activate the ion-implanted atoms, whereby source/drain regions 3a/3b are formed, as shown in FIG. 1(C).

After the process of FIG. 1(C) is completed, the SiC substrate 1 is washed and then heated-treated in a HCl gas atmosphere (where the flow rate of hydrogen gas as carrier gas is 1 slm and that of HCl gas is 3 sccm, for example) diluted with hydrogen gas in a furnace made of quartz, for example, at 1300° C. for 10 minutes. (It is also possible to perform continuous processing by using the same furnace for gas etching and high-temperature annealing so that the need for cleaning or the exchange of the furnace can be eliminated.) The SiC etch rate under these conditions is approximately 0.3 μm/h. By performing such a gas etch process, the surface of the SiC substrate can be caused to have a step-terrace structure comprised of terraces and steps that are flat on the atomic level. The width of the terraces depends on the plane orientation of the substrate (off-angle). For example, when there is an offset angle of approximately 0.2° with respect to the (0001)$_{Si}$ plane, the terrace width would be on the order of micrometers. The height of the steps would be that of four monolayers corresponding to the unit period of the layered structure of 4H—SiC in the [0001] direction by adjusting the inclination angle on the SiC substrate surface, crystal orientation in the inclined direction, and gas etch conditions. After gas etching, the SiC substrate is taken out into the atmosphere. When the thus taken-out substrate was evaluated using an atomic force microscope, it was observed that the substrate surface had a step-terrace structure and that the top of the terraces was flat on the atomic level. The height of the steps was 4 monolayers. Thus, it can be seen that, by rendering the surface of the SiC substrate as described above prior to the growth of the Group III nitride, one of the conditions required for the growth of a high-quality structure can be satisfied.

Thereafter, the surface of the SiC substrate 1 taken out into the atmosphere was treated with aqua regia, hydrochloric acid, and hydrofluoric acid sequentially, as shown in FIG. 2(E). By the hydrofluoric acid treatment, trace amounts of silicon oxide film formed on the surface of the SiC substrate 1 can be removed. On the substrate surface 2, there is formed a SiC clean surface 2. When the SiC substrate 1 after these treatments was evaluated with an atomic force microscope, a step-terrace structure was observed on the surface of the SiC substrate 1. This indicates that the step-terrace structure on the surface had remained unchanged by the aforementioned chemical treatments. When a surface analysis was performed using X-ray photoelectron spectroscopy (XPS), it was confirmed that the amount of oxygen on the surface had been significantly reduced by the hydrofluoric acid treatment. However, it was also observed that trace and yet significant amounts of oxygen still remained.

As shown in FIG. 2(F), the SiC substrate 1 was attached within a high-vacuum apparatus, such as an MBE (Molecular beam epitaxy) apparatus, and was maintained in a ultra-high vacuum state (e.g. $10^{-6}$ to $10^{-8}$ Pa). In the ultra-high vacuum state, irradiation with a Ga atomic beam or a Si atomic beam was started at temperature of 800° C. or lower (600° C. in the drawing). The temperature was then increased to 800° C. or higher (such as 1000° C.) and was maintained for a certain period. The process of heating and then maintaining the high temperature was performed at least once (twice in the drawing) and preferably three times or more. During heating, the Ga irradiation is preferably terminated.

After the temperature is lowered from 1000° C. to 600° C., irradiation with Ga is repeated and the temperature is maintained. Irradiation with Ga is then terminated and the temperature is increased to 1000° C. Thereafter, the temperature is lowered to 900° C., for example, followed by the simultaneous feeding of Al 5a and N 5b. At this point, the growth of AlN begins. Instead of the Ga atomic beam 5a, or in addition to Ga atoms 5a, a Si atomic beam may be used for irradiation. A surface analysis with XPS revealed that the amount of oxygen on the surface had been reduced to below the measurement limit of the measurement apparatus after the Ga irradiation and heating processes. Thus, by the Ga irradiation and the subsequent heating process, it becomes possible to virtually completely remove the oxygen on the surface that cannot be completely removed by the hydrofluoric acid treatment, or that becomes adsorbed on the surface before the substrate is attached to the MBE apparatus via atmosphere after the hydrofluoric acid treatment.

As shown in FIG. 3(G), the growth temperature for the AlN film is set (Ts=400° C. to 1100° C., such as 900° C., for example), and Al atoms 5a and N atoms 5b are fed to the surface of the SiC substrate 1 in a ultra-high vacuum state (such as between $10^{-6}$ and $10^{-8}$ Pa). The degree of vacuum during growth is determined by the balance between the N-atom feed amount and the evacuation capability of the growth apparatus. Under general growth conditions, it is on the order of $10^{-2}$ to $10^{-4}$ Pa. N atoms 5b were fed to the substrate surface by the rf-MBE method using RF-plasma excited active nitrogen, for example. At this point in time, an AlN layer 5 starts to grow on the surface of the SiC substrate 1.

When an in-situ electron-beam diffraction (RHEED) measurement was made after the growth of the AlN layer 5 started, oscillations were observed, indicating that the AlN layer was grown on the SiC surface in a layer-by-layer mode (a layered two-dimensional growth instead of the island-like three-dimensional growth).

The duration of the period of RHEED oscillations varies depending on growth conditions. In lower-temperature growth, duration of oscillations exceeding dozens of periods or more can be observed. Atomic force microscopic observation of the step structure on the surface of the AlN growth surface indicated that the decay of oscillations at higher temperature was due to the transition of the growth mode from the layer-by-layer growth to the step-flow growth. It is noted that the step-flow growth is also a two-dimensional growth and is preferable for crystal growth in terms of improving the quality of crystal, as is the layer-by-layer growth. When the crystal growth temperature for the AlN layer was decreased to 600° C. to 700° C., RHEED oscillations were clearly observed for 20 or more periods, thus indicating that the layer-by-layer growth can be maintained for a long time by decreasing the crystal growth temperature. However, when the temperature is 400° C. or lower, for example, the migration of atoms or the re-desorption of excess material becomes insufficient, thereby greatly deteriorating the crystallinity. Namely, it can be seen that temperature of at least 400° C. is required so as to obtain high-quality AlN.

With reference to FIG. 3(H), after the AlN layer 5 was grown to the thickness of 4 nm, a SiO$_2$ layer 7 was formed on the AlN layer 5 to a thickness of 44 nm. The SiO$_2$ layer 7 is deposited on the AlN layer 5 as an amorphous layer by sputtering or CVD process, for example. As shown in FIG. 4(I), a source electrode 11a and a drain electrode 11b are formed after removing the corresponding regions of the AlN layer 5 and the SiO$_2$ layer 7. A region of the AlN layer 5 and the SiO$_2$ layer 7 where a gate electrode 15 is to be formed is left un-removed, where the gate electrode 5 is formed.

FIG. 4(J) schematically shows the energy band structure of the structure shown in FIG. 4(I), in the direction normal to the substrate from the gate electrode 15 (right) to the SiC substrate 1 (left). As shown in FIG. 4(J), the energy discontinuous value $\Delta E_C$ in the conduction band between SiC—AlN is approximately +2.0 eV. The energy discontinuous value $\Delta E_C$ in the conduction band between AlN—SiO$_2$ is approximately +0.74 eV. Calculation of the tunneling probability based on the WKB approximation shows that the current component that tunnels from the SiC substrate 1 side to the gate electrode 15 can be greatly reduced in the layered structure consisting of the AlN layer of 4 nm and the SiO$_2$ layer of 44 nm, or to about one-tenth that in the case of a single layer of AlN of 100 nm that has the same gate insulating film capacity as the layered structure. Namely, insulation can be maintained in a wider range of electric field.

Thus, it can be seen that gate insulation can be improved by means of the MISFET according to the present embodiment. Meanwhile, since the effective transfer rate of channel electrons that travel through the SiC layer near the interface between the AlN layer 5 and the SiC substrate 1 is determined by the AlN/SiC interface, the effective transfer rate of electrons can be increased by using a high-quality AlN layer, whereby the on-characteristics of the MISFET can be improved. In order for the electrons that travel near the AlN/SiC interface to be under the influence of the AlN/SiC interface, the thickness of the AlN layer must be at least that of a single-molecule layer (which is half the c-axis lattice constant). If an island-shaped AlN layer that is smaller than the single-molecule layer is used, electrons would be directly subject to the influence of barriers of different heights, namely, AlN and SiO$_2$. As a result, they would be subject to the carrier scattering due to the difference in height of the barriers within the interface, resulting in a great deterioration in performance. The AlN layer is preferably close to flat as much as possible. This is due to the fact that, since electrons are subject to the influence of the SiO$_2$ barrier via the AlN layer, there would be differences in barrier heights to which the electrons are effectively subject if there are variations in the AlN layer thickness, whereby the electrons would be scattered. The flatness on the atomic level can be achieved by forming the AlN layer by the layer-by-layer growth or step-flow growth process.

In order to have the AlN layer function as an interface control layer, the thickness of the AlN layer is preferably 6 nm or smaller. If the AlN layer 5 is too thick, misfit dislocation develops due to the lattice mismatch with the SiC substrate 1, which results in the deterioration of the crystallinity of the AlN layer. In order to prevent such problem, the thickness of the AlN layer is preferably set below the critical film thickness where no misfit dislocation is caused. The inventors' experiments showed that dislocation starts to develop at thicknesses exceeding at least 6 nm. Therefore, it is a prerequisite to reduce the thickness of the AlN layer below 6 nm so as to prevent misfit dislocation. Reducing the thickness of the AlN layer is also significant in terms of preventing the tunneling of electrons through the AlN layer upon field application and their accumulation at the interface between AlN and SiO$_2$.

Thus, in accordance with the MISFET of the present embodiment, a good interface can be formed between the SiC substrate and the AlN layer, so that the effective channel electron mobility can be increased. Furthermore, because the SiO$_2$ layer is formed between the AlN layer and the gate electrode, the current component that tunnels from the side of the SiC substrate 1 through to the gate electrode 15 can be significantly reduced as compared with when the AlN layer alone is used.

The insulating layer on the gate electrode side may be comprised of substance other than SiO$_2$. With regard to the insulator, there are various alternatives, of which Si$_x$N$_y$ is conceivable as one of the examples other than SiO$_2$ of which deposition process has been most extensively studied.

In the following, a MISFET according to a second embodiment of the invention is described with reference to the drawings.

In the present embodiment, Al$_2$O$_3$ is used as the insulator on the gate electrode side. As shown in FIG. 5(A), the MISFET of the present embodiment includes source and drain regions 43a and 43b in a p-type SiC substrate 41 that are heavily doped with n-type impurities, layered structures 45 and 51 of AlN layer/Al$_2$O$_3$ layer formed between the source region 43a and the drain region 43b on the SiC substrate 1, and a gate electrode 55 formed on the layered structures 45 and 51. When the affinity with the AlN layer 45 is taken into consideration, it is preferable to use an insulator that contains Al as a component. In addition, Al$_2$O$_3$ is suitable for application in MISFETs because of its large bandgap, high insulation property, and large dielectric constant. FIG. 5(B) shows schematically the energy band structure of the SiC MISFET shown in FIG. 5(A) in the direction from the gate electrode 55 (right-side) toward the SiC substrate 41 (left-side). As shown in FIG. 5(B), the energy discontinuous value $\Delta E_C$ in the conduction band between SiC and AlN is approximately +2.0 eV. The energy discontinuous value $\Delta E_C$ in the conduction band between AlN and Al$_2$O$_3$ is approximately +0.29 eV. In a layered structure consisting of an AlN layer of 4 nm and an Al$_2$O$_3$ layer of 108 nm, the current component that tunnels from the SiC substrate 41 side through to the gate electrode 55 can be reduced to about one hundredth that of an AlN single layer of 100 nm with the same gate insulation film capacity as that of the layered structure. Namely, insulation can be maintained in a wider range of electric field.

In an example of the process for forming an insulator containing Al, an AlN layer, Al layer, Al$_x$N$_y$ layer, AlAs layer, or AlN$_x$As$_{1-x}$ layer (AlN in the drawing) is deposited first, and then it is oxidized, whereby an Al$_2$O$_3$ layer or an Al$_2$O$_3$ layer 5a that contains a small amount of N or As can be formed. By using the oxidation process shown in FIGS. 6(A) and (B), an AlN/Al$_2$O$_3$-based multilayer insulating film can be formed, which is preferable from the viewpoint of simplifying the process.

Thus, in accordance with the SiC-based MISFET of the present embodiment, the same effects as those obtained in the SiC-based MISFET according to the first embodiment can be obtained and, in addition, the manufacturing process can be simplified.

In the following, a SiC-based MISFET according to a third embodiment of the invention is described with reference to the drawings. FIG. 7 shows a cross section of an example of the SiC-based MISFET of the present embodiment. As shown in FIG. 7, the SiC-based MISFET of the embodiment includes a source region 23a and a drain region 23b formed in a p-SiC substrate 21, a source electrode 31a and a drain electrode 31b formed on the source region and the drain region, respectively, a B$_x$Al$_{1-x-y}$Ga$_y$N layer (x<0.4, y<0.4) formed on a channel region, and a gate electrode 35. When a BAlGaN mixed crystal is used, the in-plane lattice constant can be substantially completely matched with SiC. If the lattice constants can be matched, distortion in the interface can be reduced and the development of misfit dislocation therein can be suppressed, which is preferable. If the mixed-crystal composition increases, the so-called alloy scattering, which is based on the fluctuation in the microscopic composition of the mixed crystal, increases, which would lead to a reduction of the electron mobility. Therefore, the molar fraction of GaN and BN is preferably 40% or lower. Thus, it is preferable to use a BAlGaN layer 25 as an interface control layer such that its in-plane lattice constant has a mismatch of 0.5% or less with the in-plane lattice constant of SiC 21. It is also noted that, as shown in FIG. 7, tunnel current can be advantageously suppressed by layering a SiO$_2$ layer or Si$_x$N$_y$ layer, for example, on the BAlGaN layer.

Hereafter, a SiC-based MISFET according to a fourth embodiment of the invention is described with reference to the drawings. For the sake of affinity between the AlN layer and the electrode layer (i.e., for wettability during film formation, and the suppression of solid reaction that leads to deterioration in device characteristics), a plurality of insulators may be used. While the method for stacking a first insulator that has a good affinity with the AlN layer and a second layer that has a good affinity with metal has been described with reference to the second and third embodiments, it is also possible to form a three-layered structure consisting of a first and a second insulators and a third insulator disposed therebetween if good enough performance cannot be obtained with the first and second insulators alone, such as when the band offset is too small, for example.

FIG. 8(A) shows an example of the structure of the SiC-based MISFET according to the present embodiment. As shown in FIG. 8(A), the SiC-based MISFET of the embodiment includes a p-SiC substrate 61, a source region 63a and a drain region 63b formed in the substrate 61, a source electrode 75a and a drain electrode 75b formed on the source and drain regions, respectively, a multilayered insulator (AlN layer 65, Al$_2$O$_3$ layer 67, and SiO$_2$ layer 71) formed on a channel layer, and a gate electrode 77 formed on the multilayered insulator. FIG. 8(B) schematically shows the energy band structure of the structure shown in FIG. 8(A) in a direction normal to the substrate, from the gate electrode 77 (right) to the SiC substrate 61 (left)). As shown in FIG. 8(B), the energy discontinuous value $\Delta E_C$ in the conduction band between SiC—AlN is approximately +2.0 eV. The energy discontinuous value $\Delta E_C$ in the conduction band between AlN—Al$_2$O$_3$ is approximately +0.29 eV. The energy discontinuous value $\Delta E_C$ in the conduction band between Al$_2$O$_3$—SiO$_2$ is approximately +0.45 eV. For example, in a layered structure comprised of an AlN layer of 4 nm, an Al$_2$O$_3$ layer of 5 nm, and a SiO$_2$ layer of 42 nm, the current component that tunnels through from the SiC substrate 41 side to the gate electrode 55 can be greatly reduced as compared with the case of an AlN single layer of 100 nm with the same gate insulating film capacity as that of the layered structure. Namely, insulation can be maintained in a wider range of electric fields.

It is also possible to insert a different kind of substance between insulators so as to suppress solid reaction between them. It is noted, however, substances with relatively narrow bandgap, such as metals or semiconductors, are not preferable as such inserted substance of a different kind. If a metal or semiconductor is used, charges may become accumulated in the inserted substance, or resonance tunneling might occur, which would cause histeresis or deterioration in the gate insulation property.

Hereafter, a SiC-based transistor according to a fifth embodiment of the invention is described with reference to the drawings. The SiC-based transistor according to the present embodiment is a field effect transistor having a floating-gate structure consisting of a metal/insulator/metal/insulator/an interface control layer of thickness of one molecule-layer or greater containing Al and N/SiC structure. Field effect transistors with floating-gate structure can be applied to a variety of devices, such as a nonvolatile memory, for example. FIG. 9(A) shows an example of the structure of a nonvolatile memory device based on the MISFET of the present embodiment. As shown in FIG. 9(A), the nonvolatile memory device of the present embodiment includes a p-SiC substrate 81, a source and a drain regions 83a and 83b formed in the substrate 81, a layered structure formed on a channel region and consisting of an AlN layer 85, a GaN layer 95b, and an AlN layer 91, a source and a drain electrodes 95a and 95b formed for the source and drain regions 83a and 83b, and a gate electrode (control electrode) 97 formed on the aforementioned layers.

FIG. 9(B) schematically shows the energy band structure of the structure shown in FIG. 9(A) in a direction normal to the substrate, from the gate electrode 97 (right) to the SiC substrate 81 (left)). As shown in FIG. 9(B), between the two AlN layers 85 and 91 formed on the SiC substrate 81, there is formed a GaN layer 87 that has an energy band discontinuous value of approximately −2 eV in conduction band with respect to AlN. The GaN layer 87 functions as a quantum well layer surrounded on either side by an energy barrier layer, and electrons from the channel layer can be stored in this quantum well layer (87). Because the barrier height is high at 2 eV, the amount of electrons that go back from the quantum well (87) to the channel layer is small, even at room temperature. Taking advantage of the fact that the threshold voltage of the transistor shown in FIG. 9(A) varies depending on the amount of electrons (charge) stored in the quantum well layer (87), a nonvolatile memory device can be constructed.

When a power transistor with ultralow loss, a high-output high-frequency transistor, or a field effect transistor that has an extremely small gate length is formed on SiC, the above-described memory device can be advantageously integrated on the same substrate.

In the present specification, the term "SiC surface structure" is used to refer to both the surface of an SiC substrate and the surface of an SiC layer deposited on a different type of material, such as a SiC substrate or a sapphire substrate. Similarly, the term "SiC substrate" includes a substrate having SiC on the surface thereof.

While planar MISFETs have been described in the present specification, the invention is not limited to the planar type. In power transistors, vertical-type FETs such that the drain electrode is disposed on the back of the substrate are often used. Although they differ in the structure of the source or drain, for example, their metal-insulator-semiconductor structure for switch function is the same, placing them within the range of application of the present invention.

When "Group-III nitrides" are referred to, they include at least one of Group-III element of B, Al, Ga, or In, in addition to N. They may contain Group-V elements other than N. The term also includes not only compounds such as GaN and AlN, but also mixed crystals such as $Al_xIn_yGa_{1-x-y}N$.

Figure 1A:
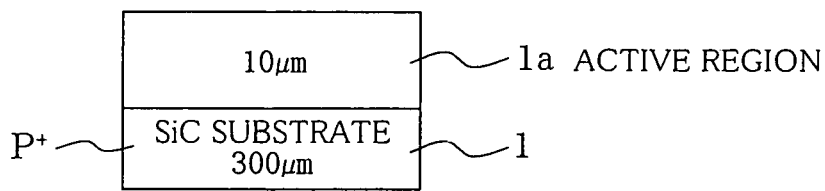
FIGS. 1(A) to (C) show a method for manufacturing a MISFET according to a first embodiment of the invention.
Figure 1B:
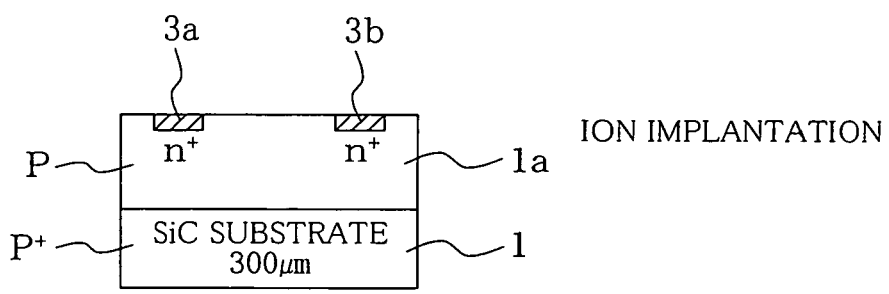
Figure 1C:
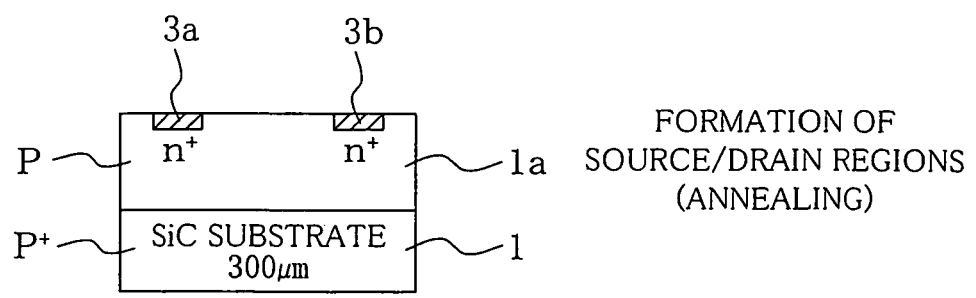
Figure 2D:
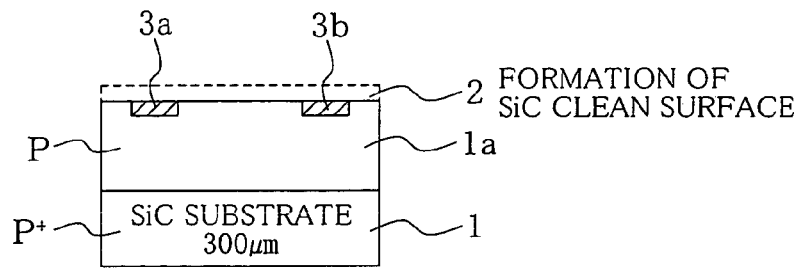
FIGS. 2(D) to (F) show the method for manufacturing the MISFET according to the first embodiment of the invention, continuous from FIG. 1.
Figure 2E:
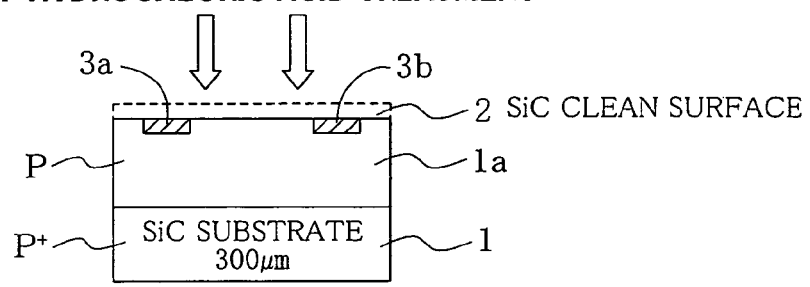
Figure 2F:
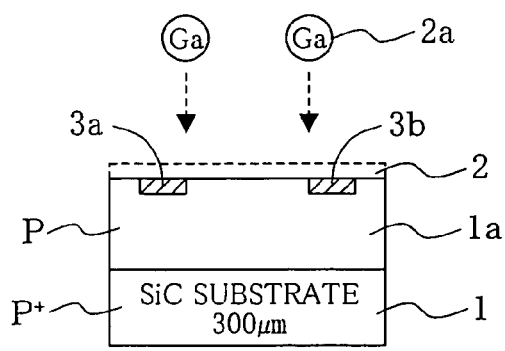
Figure 3G:
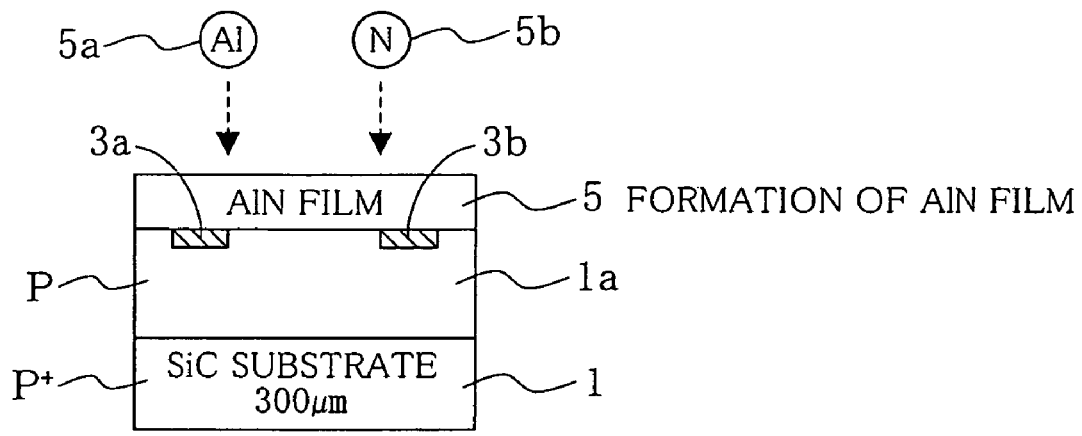
FIGS. 3(G) to (H) show the method for manufacturing the MISFET according to the first embodiment of the invention, continuous from FIG. 2.
Figure 3H:
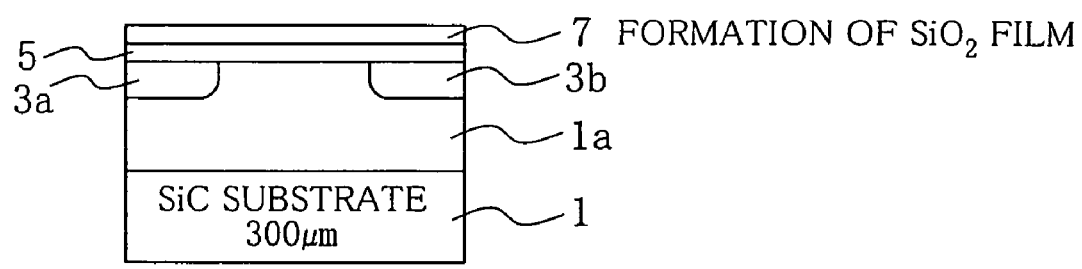
Figure 4I:
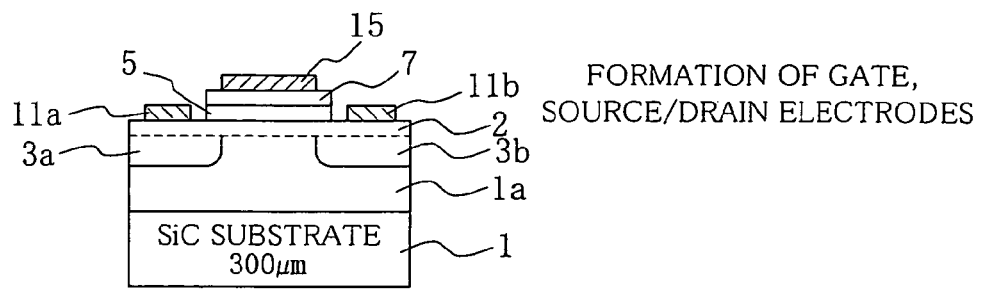
FIG. 4(I) shows the method for manufacturing the MISFET according to the first embodiment of the invention, continuous from FIG. 3.
Figure 4J:
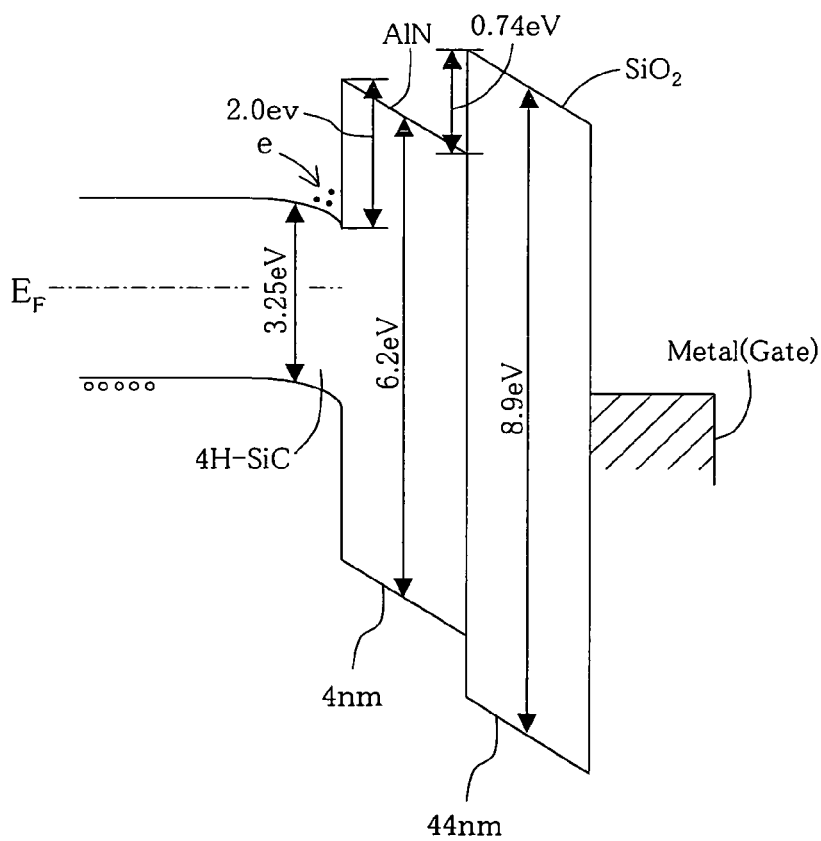
FIG. 4(J) shows the energy band structure of the MISFET shown in FIG. 4(I), from the gate to the substrate thereof.
Figure 5A:
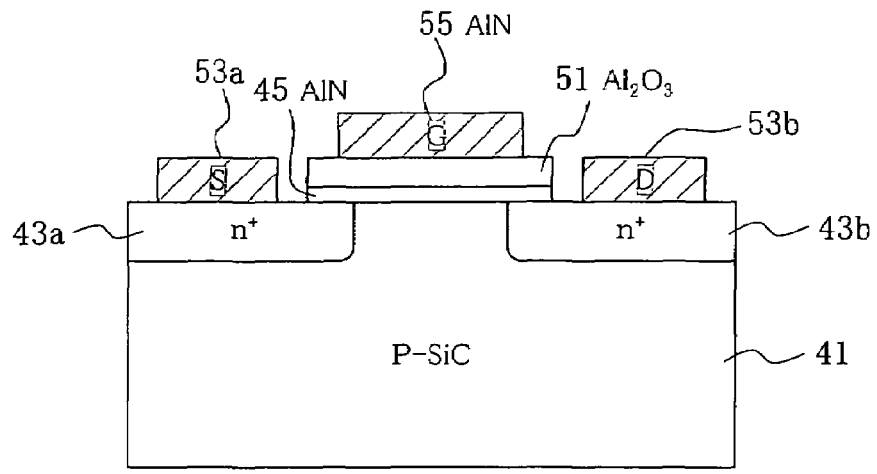
FIG. 5 shows the structure of a MISFET according to a second embodiment of the invention (FIG. 5(A)) and its energy band structure (FIG. 5(B)).
Figure 5B:
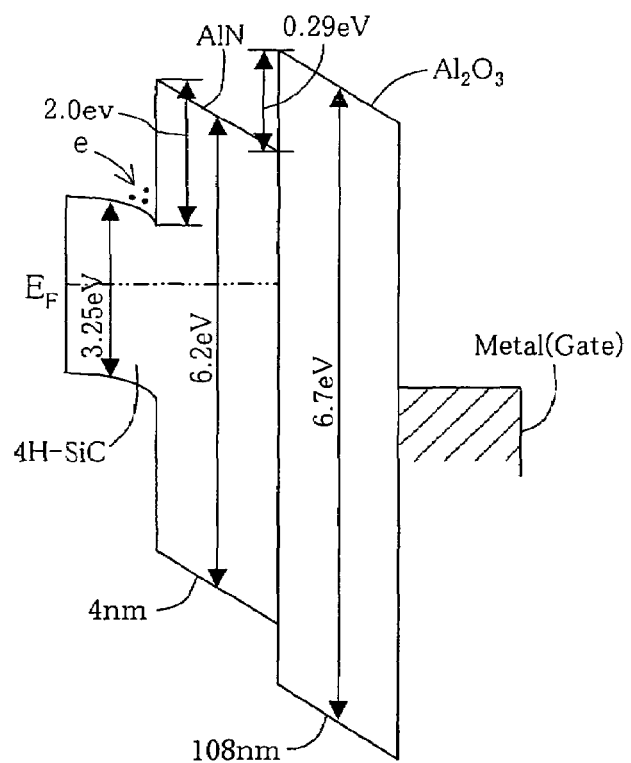
Figure 6A:
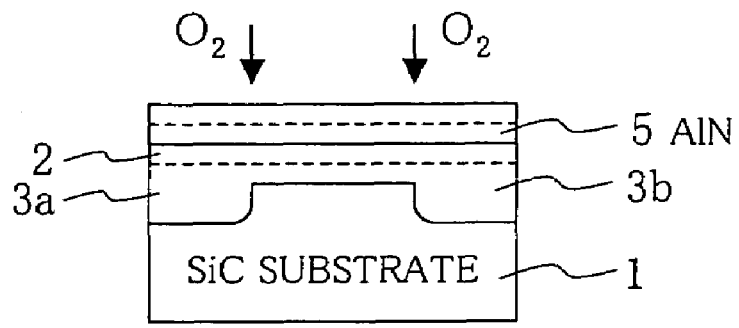
FIG. 6 shows an example of the process for manufacturing a structure shown in FIGS. 6(A) and (B)
Figure 6B:
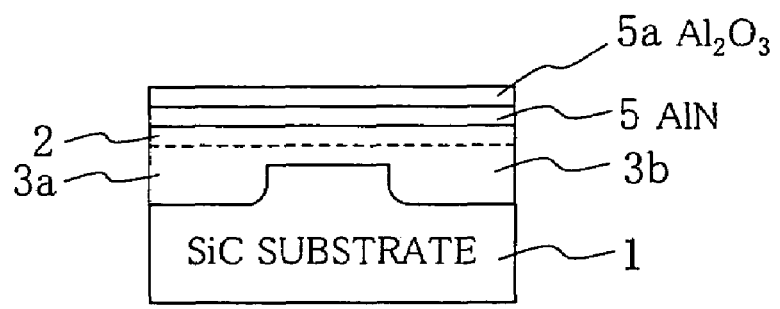
Figure 7:
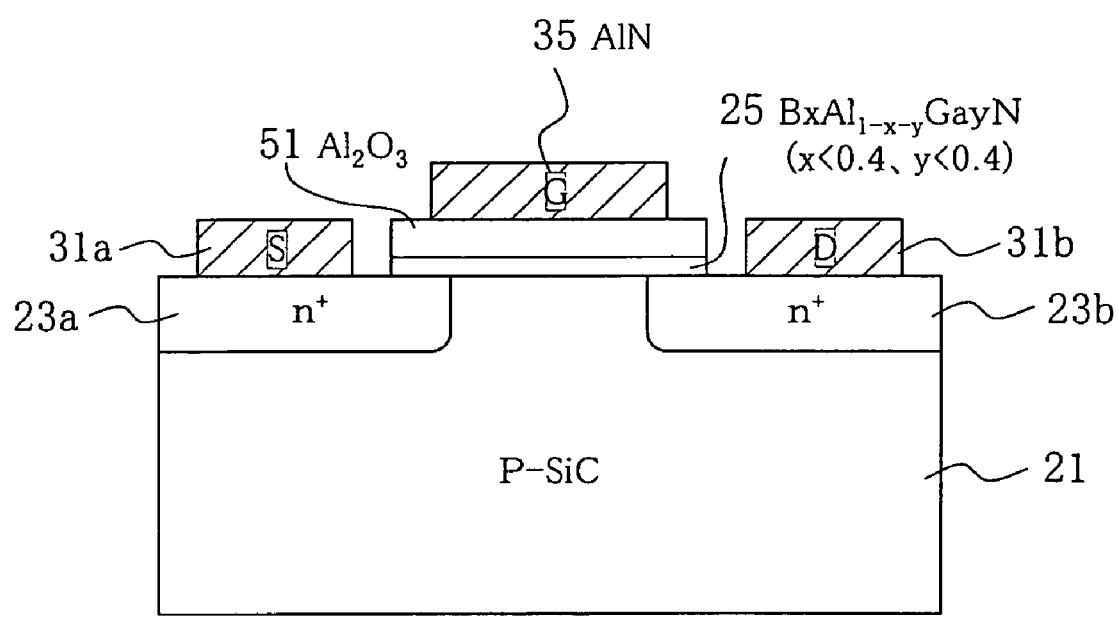
FIG. 7 shows the structure of a MISFET according to a third embodiment of the invention.
Figure 8A:
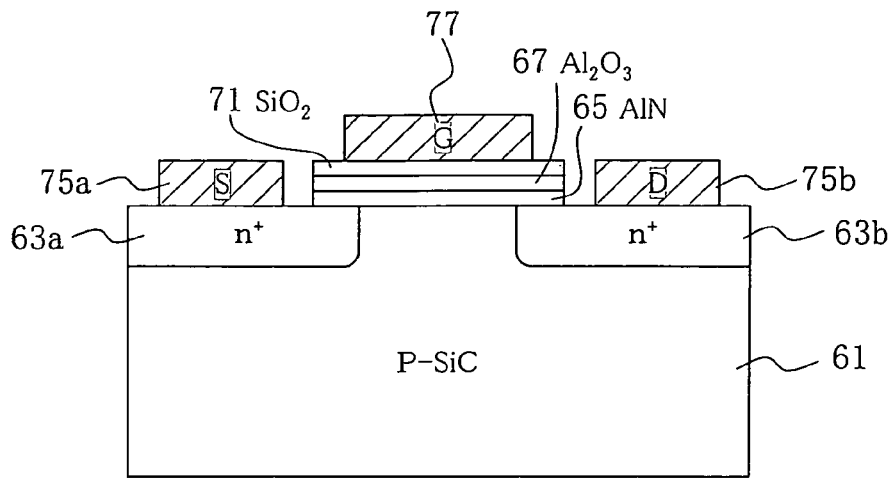
FIG. 8 shows the structure of a MISFET according to a fourth embodiment of the invention.
Figure 8B:
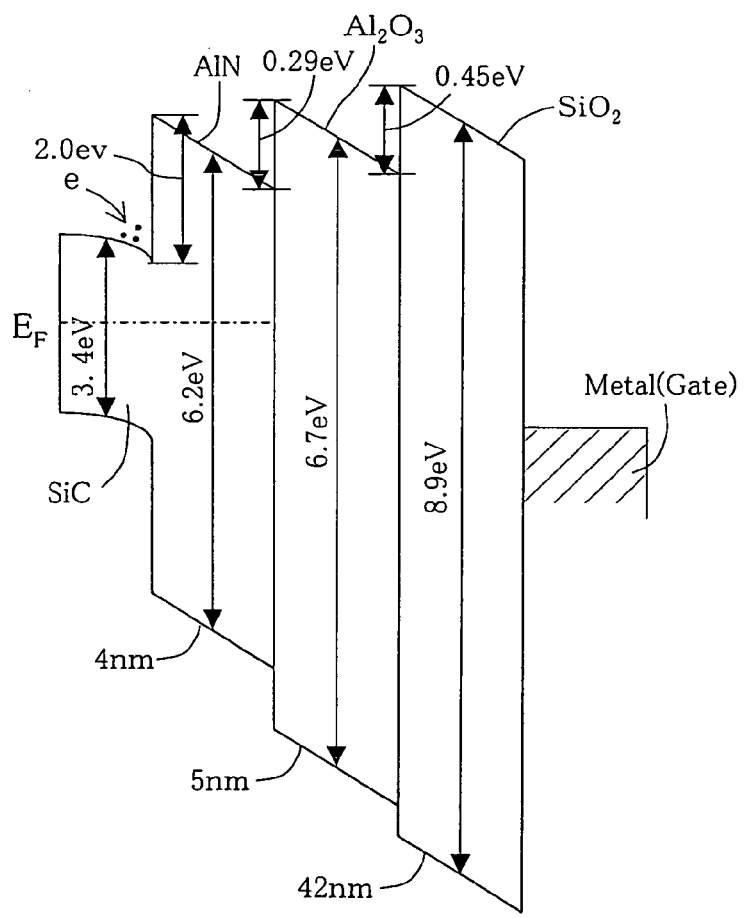
Figure 9A:
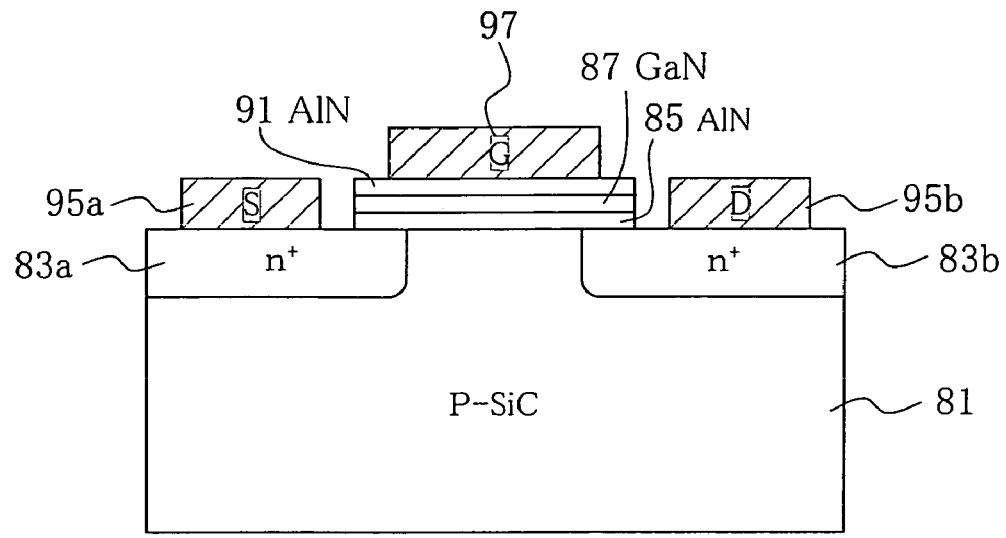
FIG. 9 shows a MISFET according to a fifth embodiment of the invention, which is a field effect transistor of a floating-gate structure, showing the structure thereof.
Figure 9B:
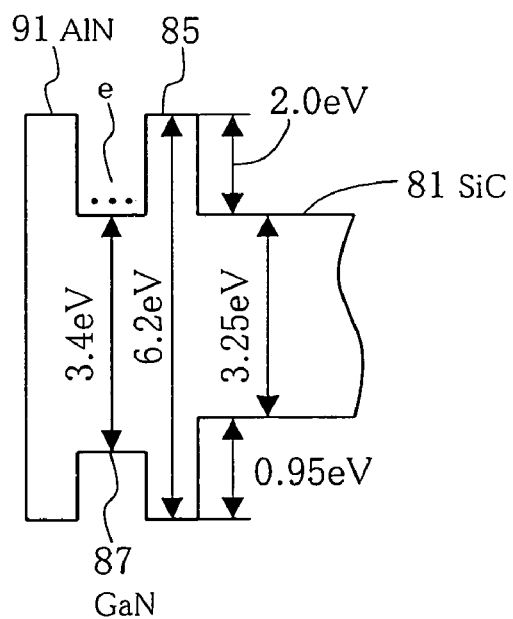
Figure 10:
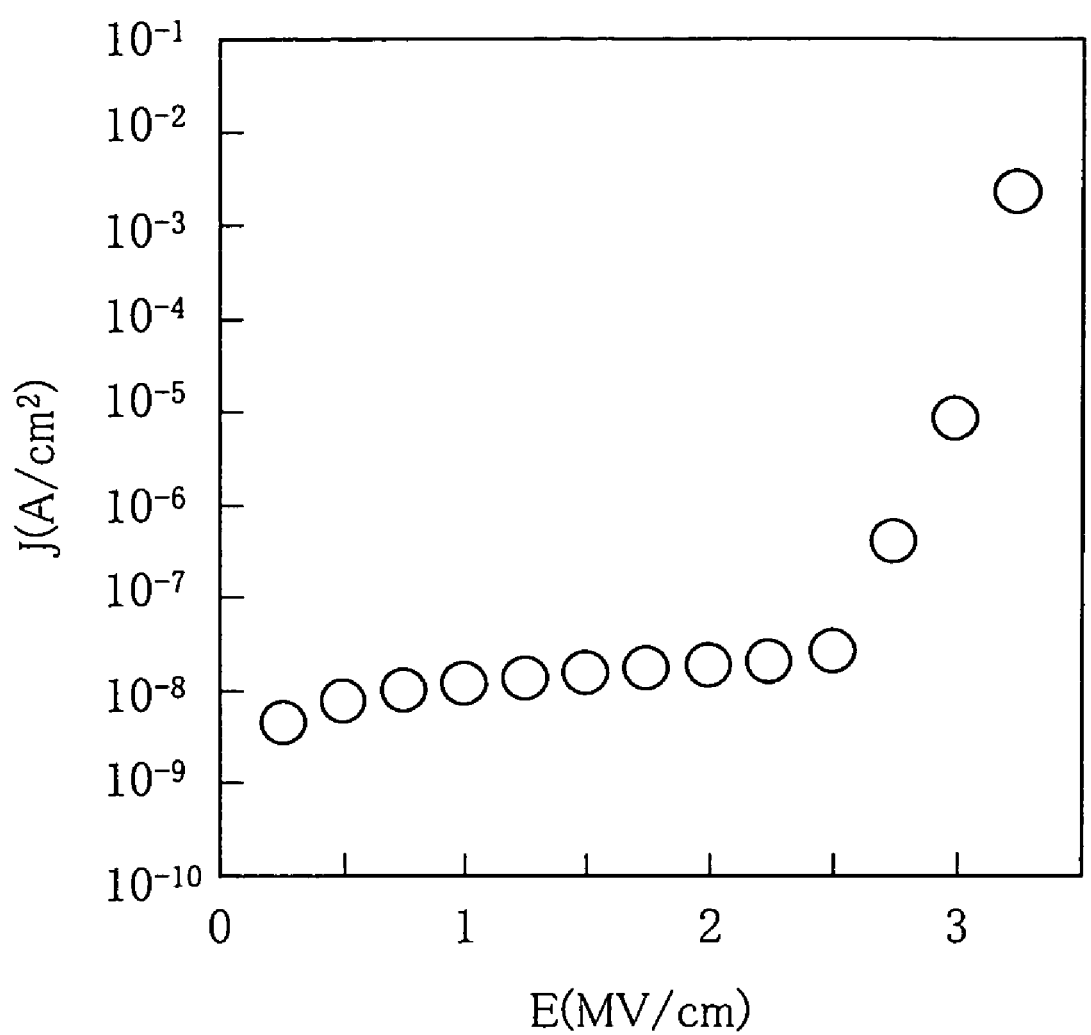
FIG. 10 shows the relationship between electric field strength and current density of an AlN/SiC MIS diode.

The invention claimed is:

1. A non-volatile memory element comprising:
an SiC surface structure;
a floating-gate structure formed on said SiC surface structure, wherein said floating-gate structure includes an interface control layer, a first insulator barrier layer, a floating-gate layer formed of a metal or a semiconductor quantum well, a second insulator barrier layer, and a gate electrode layer, wherein said interface control layer is a Group-III nitride layer formed in contact with said SiC surface structure and having a film thickness in the range of one molecule-layer to a critical film thickness such that no misfit dislocation occurs with said SiC surface structure; and
a source and a drain formed on said SiC surface structure adjacent to said floating-gate structure.

2. The nonvolatile memory element according to claim 1, wherein said interface control layer is AlN having a thickness of 6 nm or smaller.

3. The field effect transistor according to claim 1, wherein said first insulator barrier layer has a double-layered film structure on said interface control layer, said double-layered film structure comprising an $Al_2O_3$ layer and a $SiO_2$ layer layered in order.

4. The nonvolatile memory element according to claim 1, wherein said first insulator barrier layer comprises a layer formed from a material that is different from said interface control layer and that has a greater band offset with respect to a conduction carrier than said interface control layer.

5. The field effect transistor according to claim 2, wherein said first insulator barrier layer has a double-layered film structure on said interface control layer, said double-layered film structure comprising an $Al_2O_3$ layer and a $SiO_2$ layer layered in order.

6. A nonvolatile memory element comprising:
an SiC surface structure;
a floating-gate structure formed on said SiC surface structure including a first insulator barrier layer, a well layer, a second insulator barrier layer, and a gate electrode layer, wherein said first insulator barrier layer is formed in contact with said SiC surface structure and comprises a Group-III nitride epitaxial layer, said well layer is formed of a Group-III nitride epitaxial layer and functions as a floating gate, and said second insulator barrier layer is formed of a Group-III nitride epitaxial layer; and a source and a drain formed in said SiC surface structure adjacent to said floating-gate structure.

7. The nonvolatile memory element according to claim 6, wherein said first insulator barrier layer is a Group-III nitride layer that has a film thickness in the range of one molecule-layer to a critical film thickness such that no misfit dislocation with said SiC surface structure occurs.

8. The nonvolatile memory element according to claim 6, wherein said first insulator barrier layer is a layer comprised of AlN and having a thickness of one molecule-layer or greater to 6 nm or smaller.

9. The nonvolatile memory element according to claim 6, wherein said well layer contains Ga and N.

10. The nonvolatile memory element according to claim 6, wherein said second insulator barrier layer contains Al and N.

* * * * *

UNITED STATES PATENT AND TRADEMARK OFFICE
CERTIFICATE OF CORRECTION

| | |
|---|---|
| PATENT NO. | : 7,622,763 B2 |
| APPLICATION NO. | : 10/565624 |
| DATED | : November 24, 2009 |
| INVENTOR(S) | : Suda et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 826 days.

Signed and Sealed this

Twenty-sixth Day of October, 2010

David J. Kappos
*Director of the United States Patent and Trademark Office*